(12) United States Patent
Rivoir

(10) Patent No.: US 8,378,707 B2
(45) Date of Patent: Feb. 19, 2013

(54) EVALUATION OF AN OUTPUT SIGNAL OF A DEVICE UNDER TEST

(75) Inventor: Jochen Rivoir, Böblingen (DE)

(73) Assignee: Advantest (Singapore) Pte Ltd, Singapore (SG)

( * ) Notice: Subject to any disclaimer, the term of this patent is extended or adjusted under 35 U.S.C. 154(b) by 1695 days.

(21) Appl. No.: 11/647,118

(22) Filed: Dec. 28, 2006

(65) Prior Publication Data

US 2007/0150224 A1 Jun. 28, 2007

Related U.S. Application Data

(63) Continuation of application No. PCT/EP2004/051401, filed on Jul. 7, 2004.

(51) Int. Cl.
*G01R 31/02* (2006.01)
(52) U.S. Cl. .................................. 324/762.01
(58) Field of Classification Search . 324/762.01–762.03
See application file for complete search history.

(56) References Cited

U.S. PATENT DOCUMENTS

| | | | | |
|---|---|---|---|---|
| 4,001,818 A | * | 1/1977 | Radichel et al. | 340/520 |
| 4,629,889 A | | 12/1986 | Todokoro et al. | 250/310 |
| 4,664,246 A | | 2/1987 | Halbert et al. | 364/487 |
| 5,453,995 A | | 9/1995 | Behrens | 371/27 |
| 5,499,248 A | | 3/1996 | Behrens et al. | 371/22.1 |
| 6,700,401 B2 | * | 3/2004 | Lapidus | 326/27 |
| 7,394,277 B2 | * | 7/2008 | Ishida et al. | 324/762.01 |
| 8,134,356 B2 | * | 3/2012 | Dobberpuhl et al. | 324/76.39 |
| 8,269,520 B2 | * | 9/2012 | Conner | 324/762.01 |
| 2002/0014451 A1 | | 2/2002 | Janik et al. | 210/437 |
| 2002/0140451 A1 | | 10/2002 | Sakayori et al. | |
| 2002/0180477 A1 | * | 12/2002 | Inoshita et al. | 324/765 |
| 2005/0218919 A1 | * | 10/2005 | Yeh | 324/761 |

FOREIGN PATENT DOCUMENTS

| | | |
|---|---|---|
| EP | 0 747 716 | 12/1996 |
| EP | 0 747 716 A2 | 12/1996 |
| EP | 0 859 318 | 8/1998 |
| EP | 0 864 977 | 9/1998 |
| EP | 0 882 991 | 12/1998 |
| EP | 0 886 214 | 12/1998 |
| EP | 1 092 983 | 4/2001 |
| JP | 09-197018 | 7/1997 |
| JP | 2001-324552 | 11/2001 |
| JP | 2003-149297 | 5/2003 |

* cited by examiner

*Primary Examiner* — Joshua Benitez Rosario
(74) *Attorney, Agent, or Firm* — Holland & Hart LLP

(57) ABSTRACT

The present invention relates to a method for evaluating an output signal of a Device Under Test, wherein said Device Under Test outputs said output signal in response to an input signal provided by an Automated Test Equipment, said method including the steps of: generating a difference signal representing the difference between said output signal of said Device Under Test and a reference signal, integrating said difference signal during a clock period respectively, resulting in an integrated difference signal, and evaluating said integrated difference signal with regard to a bit level to be assigned to said output signal of said Device Under Test during the respective clock period.

11 Claims, 7 Drawing Sheets

EVALUATION OF AN OUTPUT SIGNAL OF A DEVICE UNDER TEST

CROSS-REFERENCE TO RELATED APPLICATIONS

This application is a continuation of copending International Application No. PCT/EP2004/051401, filed Jul. 7, 2004, which designated the United States and is incorporated herein by reference in its entirety.

BACKGROUND OF THE INVENTION

1. Field of the Invention

The present invention relates to an improvement of evaluation of an output signal of a Device Under Test (DUT) in response to an input signal provided by an Automated Test Equipment (ATE) to said DUT.

2. Description of Prior Art

Integrated Circuits (IC) generally need to be tested to assure proper operation. This—in particular—is required during IC development and manufacturing. In the latter case, the ICs are usually tested before final application. During test, the IC, as Device Under Test (DUT), is exposed to various types of stimulus signals, and its responses are measured, processed and usually compared to an expected response of a good device. Automated Test Equipments (ATE) usually perform these tasks according to a device-specific test program. Examples for ATE are the Agilent 83000 and 93000 families of Semiconductor Test Systems of Agilent Technologies as disclosed e.g. under http://www.ate.agilent.com/ste/products/intelligent_test/SOC_test/SOC_Tech Oview.shtml. Details of those families are also disclosed e.g. in EP-A-859318, EP-A-864977, EP-A-886214, EP-A-882991, EP-A-1092983, U.S. Pat. No. 5,499,248, U.S. Pat. No. 5,453,995.

According to the prior art a clocked comparator is used for comparing the voltage level of the output signal of the DUT at the ATE input against a threshold level at a predetermined point in time within the clock period. In the event of a disturbing signal near or even at this particular point in time there is a significant distortion of the output signal of the DUT, and the clocked comparator may come to an incorrect bit level evaluation.

SUMMARY OF THE INVENTION

It is an object of the invention to provide an improved output signal evaluation for the output signal of the DUT. It is a further object to improve testing of electronic devices by using the improved signal evaluation.

In accordance with a first aspect, the invention provides a method for evaluating an output signal of a Device Under Test, wherein said Device Under Test outputs said output signal in response to an input signal provided by an Automated Test Equipment, said method including the steps of:
  generating a difference signal representing the difference between said output signal of said Device Under Test and a reference signal,
  integrating said difference signal during a clock period respectively, resulting in an integrated difference signal, and
evaluating said integrated difference signal with regard to a bit level to be assigned to said output signal of said Device Under Test during the respective clock period.

In accordance with a second aspect, the invention provides a software program or product, preferably stored on a data carrier, for executing the method for evaluating an output signal of a Device Under Test, wherein said Device Under Test outputs said output signal in response to an input signal provided by an Automated Test Equipment, said method including the steps of:
  generating a difference signal representing the difference between said output signal of said Device Under Test and a reference signal,
  integrating said difference signal during a clock period respectively, resulting in an integrated difference signal, and
  evaluating said integrated difference signal with regard to a bit level to be assigned to said output signal of said Device Under Test during the respective clock period,
when running on a data processing system such as a computer.

In accordance with a third aspect, the invention provides a system for evaluating an output signal of a Device Under Test, wherein said Device Under Test outputs said output signal in response to an input signal provided by an Automated Test Equipment, said system including:
  a generator for generating a difference signal representing the difference between said output signal of said Device Under Test and a reference signal,
  an integrator for integrating said difference signal during a clock period respectively, resulting in an integrated difference signal, and
  an evaluator for evaluating said integrated difference signal with regard to a bit level to be assigned to said output signal of said Device Under Test during the respective clock period.

Preferred embodiments are defined by the dependent claims.

By integrating a difference signal during a clock period it is possible that distortions within the output signal, which has to be evaluated, e.g. glitches, crosstalk, ringing, overshoot, reflections etc., can be tolerated independent of the point in time they occur within the clock period. Excessive distortions can occur in particular in loop-back test to ATE when the DUT driver is not designed to drive a long cable to the ATE.

In a first type of embodiments of the present invention a difference is generated between the output signal of the DUT and a reference signal being a threshold signal. The signal value of the threshold signal is preferably constant at least during the clock period, preferably during the test procedure. Generating the difference signal is performed continuously, in particular non-clocked. The difference signal is integrated during the whole duration of the bit time, i.e. during the corresponding clock period, wherein the integrator is reset at the beginning or the end of each clock period, preferably reset to the value zero.

The integrated difference signal is subsequently input in a comparator resulting in a comparison signal that is sampled at predetermined points in time, in particular once per clock period respectively. The sampled comparison signal is interpreted as the bit to be detected according to the evaluation and to be assigned to the output signal of the DUT. If the comparative signal value of the comparator is zero, then the sign of the sampled comparison signal is interpreted as the bit to be detected.

In an alternative of this first type of embodiments of the present invention, the difference signal between the output signal of the DUT and the reference signal can be compared by a comparator, e.g. comparing the output signal of the DUT with a threshold signal. The binary output signal of this comparator is subsequently oversampled and the oversampled binary output values of the comparator are evaluated to determine the bit to be detected for the corresponding output signal. The oversampled binary output values of the comparator can be stored in a memory. The evaluation of the output signal of the DUT is then based an those oversampled binary output values of the comparator by any suitable rule, e.g. by the rule that the bit level to be evaluated for the output signal of the DUT is determined by the majority of the stored binary oversampled output values of the comparator.

According to this first type of embodiments of the present invention the bit evaluated for the output signal according to the present invention can be compared against an expected bit value for bit error testing.

According to a second type of embodiments of the present invention the difference between the output signal of the DUT and a reference signal representing the expected value for this output signal is integrated during the whole duration of a bit time. At the end of the bit time the integrated value is compared against an error threshold to determine bit errors. The corresponding error threshold represents the amount of energy of the distortions, e.g. glitch energy that can be tolerated. Preferably, the error threshold values are programmable so that they can be adjusted from application to application, if necessary.

Integrating said difference between the output signal of the DUT and the reference signal is preferably performed continuously. The integrated difference signal is reset periodically to a predetermined value, preferably to zero, in order to have the same starting conditions for each clock period. The comparator following the integration can either use one comparative signal, preferably the value zero, or can use a number of comparative signals thus realizing the function of a window comparator. Accordingly it can be distinguished whether the output signal of the integrator is above a first upper threshold value, below a second lower threshold value, or between the first and second threshold values.

For the second type of embodiments of the present invention, wherein the reference value for the step of generating a difference signal is a binary signal representing a bit value expected for the output signal of said DUT in the respective clock period, the low and/or high level of said binary signal, i.e. the high voltage level representing a binary "1" and the low voltage level representing a binary "0", can be adjusted or is programmable.

The present invention also relates to a software program or product for executing the method for synchronizing digital clock signals when running on a date processing system such as a computer. Preferably, the program or product is stored on a data carrier.

Furthermore, the present invention relates to a system for evaluation of the output signal of the DUT according to the present invention.

BRIEF DESCRIPTION OF THE DRAWINGS

These and other objects and features of the present invention will become clear from the following description taken in conjunction with the accompanying drawing, in which.

DESCRIPTION OF PREFERRED EMBODIMENTS

Figure 1:
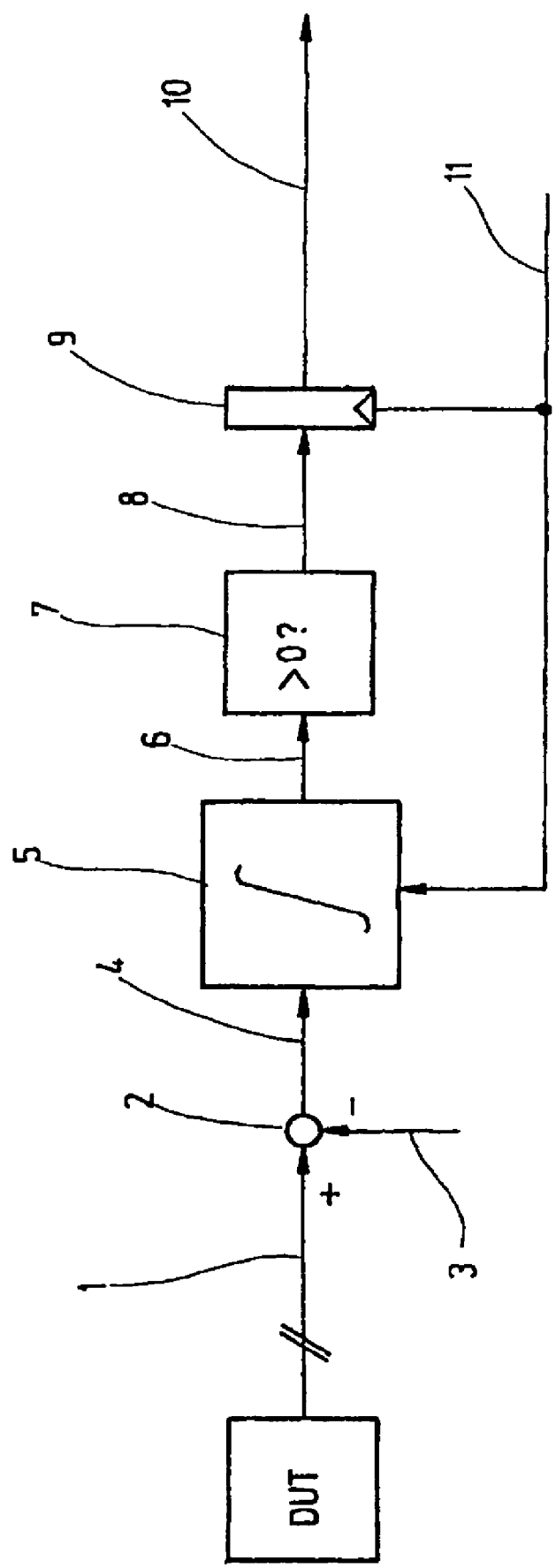
FIG. 1 shows a block diagram of a first embodiment of the invention.

FIG. 1 shows a block diagram of a first embodiment of the present invention. The block diagram represents a method for evaluating an output signal 1 of a device under test DUT which might be located significantly remote from the input of the ATE, i.e. the length of the line for the output signal 1 can amount to several decimeter or even more than one meter. A first difference calculating means 2 generates a difference signal 4 representing the difference between the output signal 1 and a reference signal 3. In this first embodiment the reference signal 3 is represented by a threshold value, wherein the threshold value can be adapted to the particular application, i.e. can be programmed specifically for the particular DUT or specifically for the particular test sequence.

Using means 5 for integration, the difference signal 4 is integrated resulting in an integrated difference signal 6, which is evaluated in this first embodiment by a simple comparator means 7 comparing the integrated difference signal 6 whether being greater than zero or not. Accordingly the output signal 8 of the comparator means 7 is "high", if the integrated difference signal is higher than zero, otherwise being "low". A controllable switch 9 makes the output signal 8 of the comparator means 7 available as output signal 10 of this first embodiment, representing the bit evaluated for the output signal 1 of the DUT in this particular clock period. The switch 9 is controlled by clock line 11. Furthermore the clock line 11 resets the means 5 for integration at any rising edge or at any falling edge of the clock signal.

Figure 2:
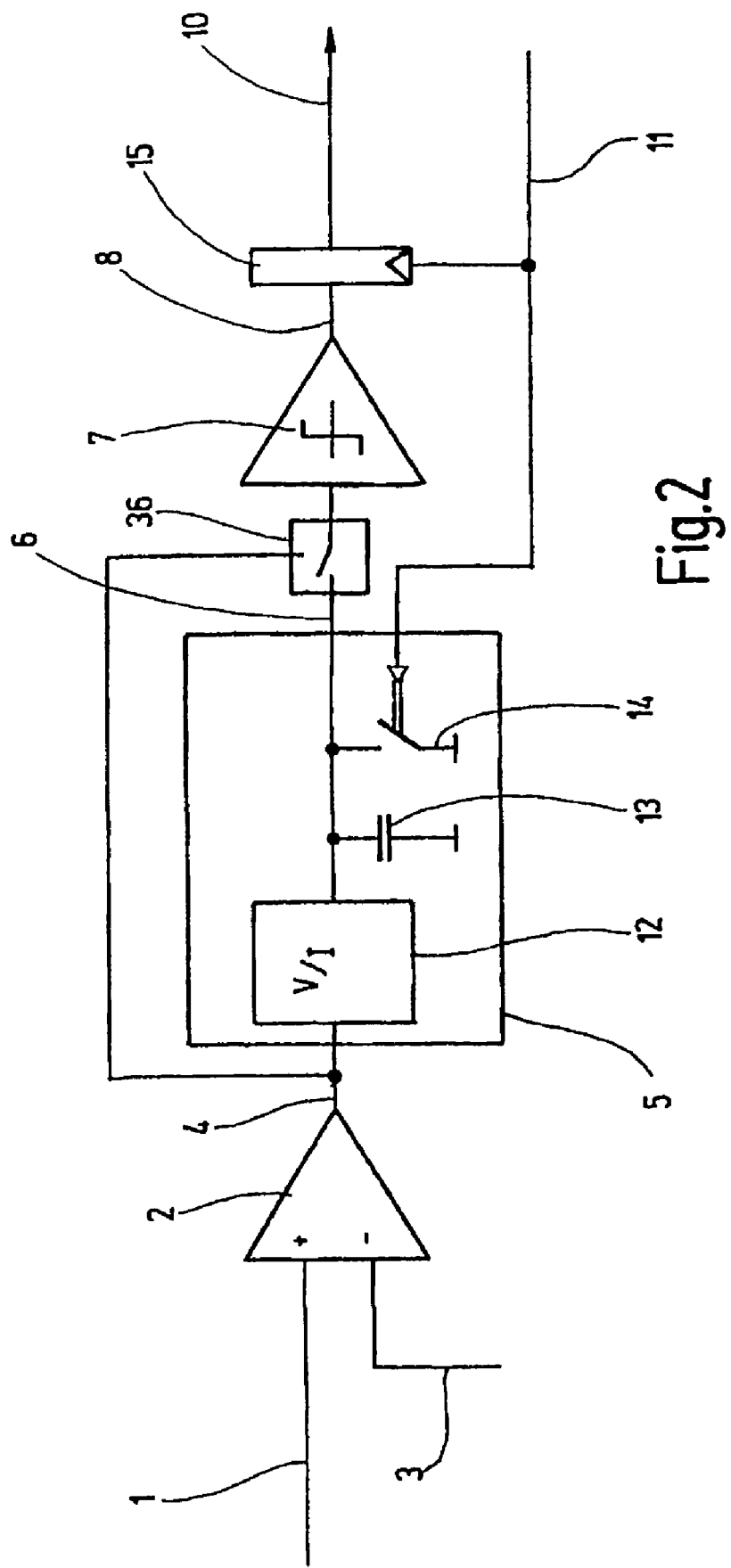
FIG. 2 shows in more detail a second embodiment of the invention.
Figure 3:
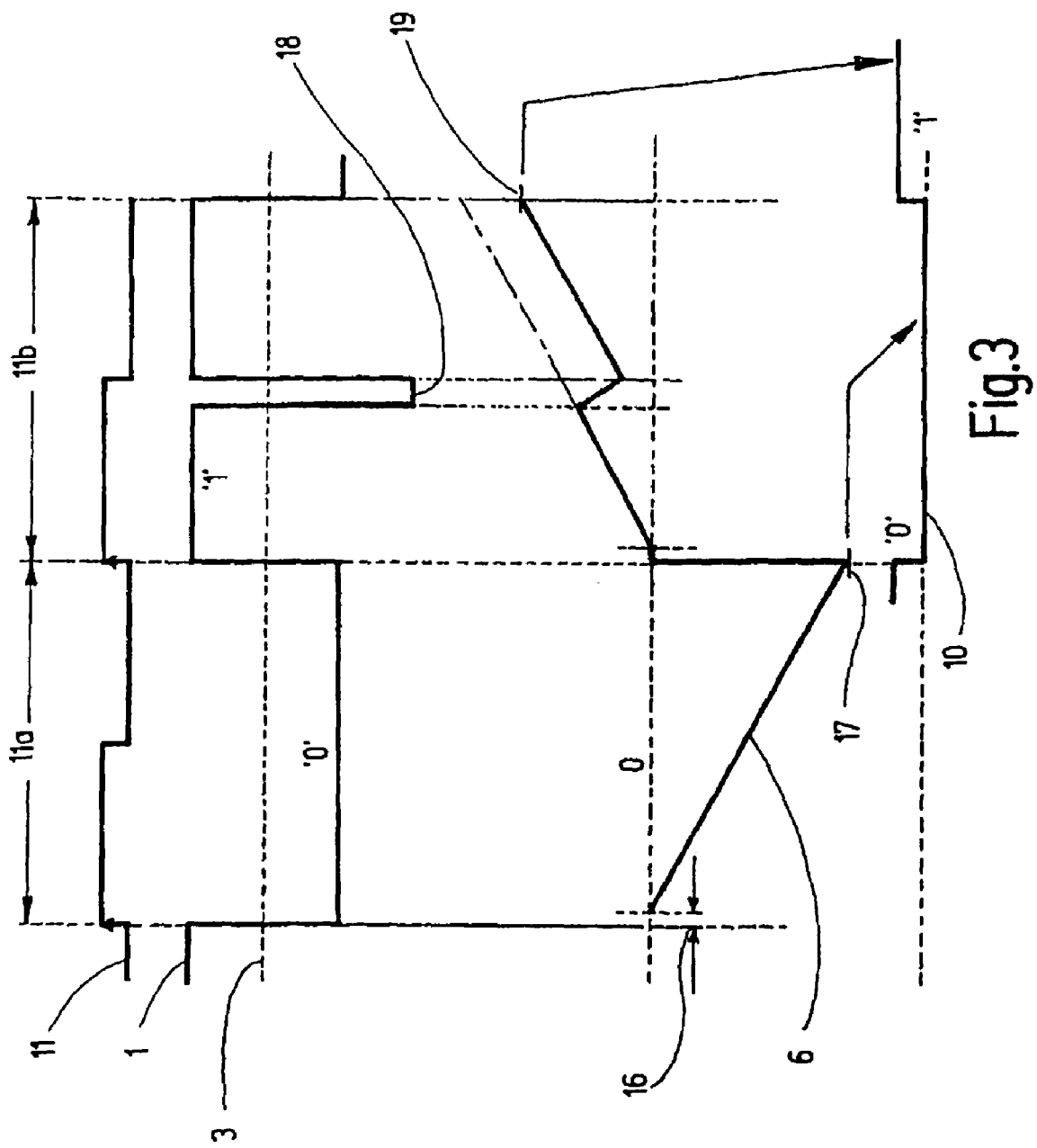
FIG. 3 is a signal diagram for two clock periods corresponding to the second embodiment shown in FIG. 2.

FIG. 2 shows in more detail a second embodiment of the present invention. Same features are referenced with the same reference number as for the first embodiment. The difference calculating means 2 is realized by an operational amplifier. The means 5 for integration comprising a voltage-to-current (V/I) converter 12 feeding a capacitor 13 for integration purpose. The capacitor 13 and thus the means 5 for integrating are reset by controllable switch 14, which is controlled by clock line 11. The comparator means 7 can be realized by an operational amplifier, the output signal 8 of which is passed by a controllable gate or switch 15 as output signal 10 of the embodiment. An optional mode switch 36 is switched to drive the comparator means 7 either by the integrated difference signal 6 or directly by the difference signal 4. The output signal 10 has to be regarded as the bit evaluated for the output signal 1 of the DUT and can subsequently be stored or compared by the ATE against an expected bit in order to detect bit errors. FIG. 3 is a signal diagram corresponding the second embodiment shown in FIG. 2 for two clock periods 11a, 11b. The upper line represents clock signal 11, below of which is shown the output signal 1 of the DUT. The dotted line represents the reference signal 3, i.e. the threshold value. In the first period 11a the output signal is undisturbed on bit level "0" or "low". At the beginning of each clock period 11a, 11b the integrated difference signal 6 is set to zero by discharging the capacitor 13. The time 16 required for reliable reset is indicated with arrows for the first period in FIG. 3. Subsequently, due to the level "0" of the output signal 1, the integrated difference signal 6 falls to negative values reaching negative end value 17, which is assigned to the bit value "0" of the output signal 1 as represented by output signal 10 shown as the lowest line in FIG. 3. In the second clock period 11b the output signal 1 is originally on binary "1" or "high" value. During the second clock period 11b a glitch 18 occurs. According to the prior art it would be possible, that if the bit level of the output signal 3 is evaluated by sampling unfortunately during occurrence of the glitch 18, a bit level "0" would be assigned for the output signal 1 during the second clock period 11b. According to the present invention, this misevaluation is avoided. Although the integrated difference signal 6 reaches an end value 19 at the end of the second clock period 11b being lower than for a undisturbed input signal 1 representing a binary "1", the reduced positive end value 19 can still be reliably evaluated as a binary "1" by the output signal 10.

Figure 4:
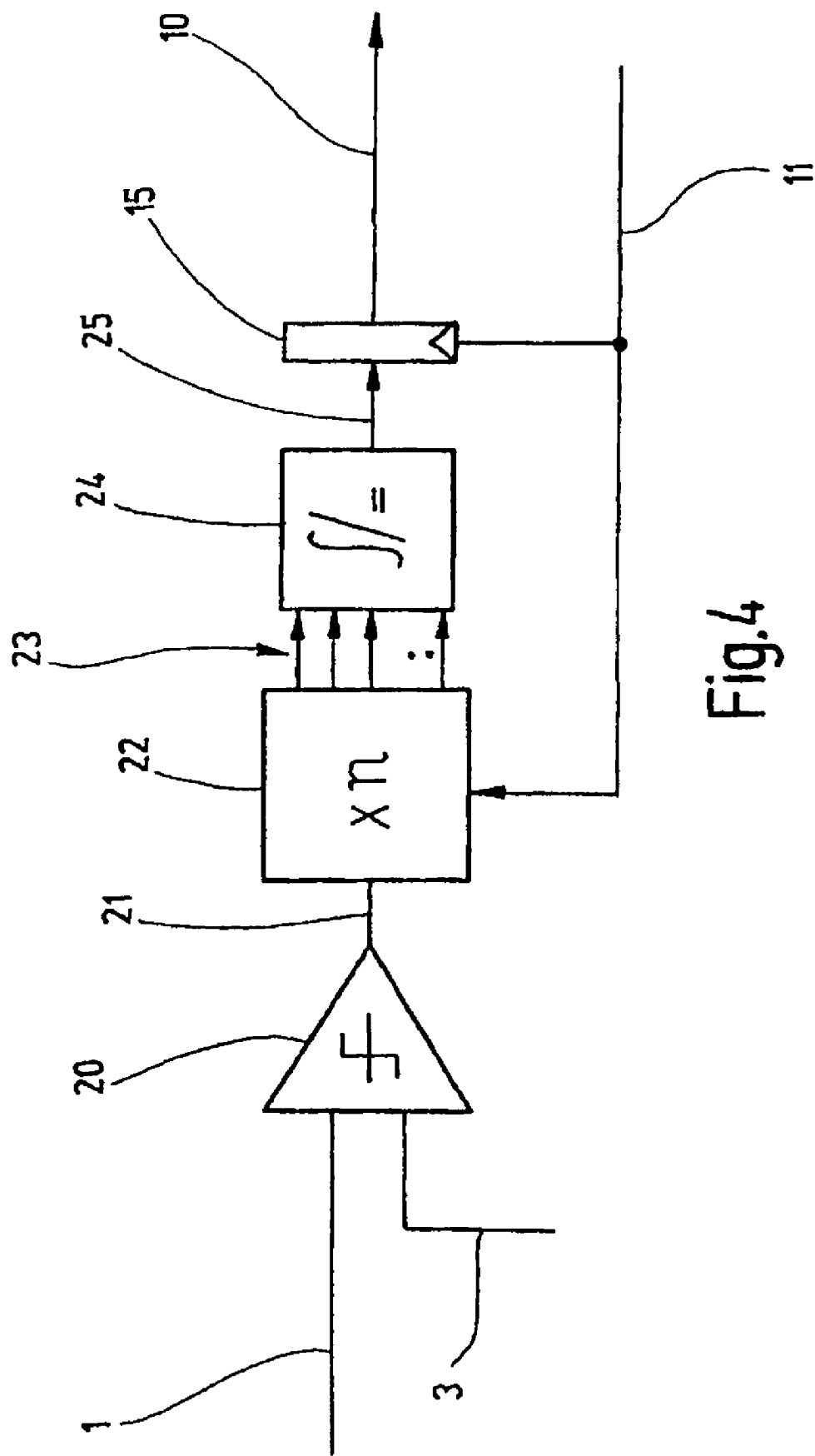
FIG. 4 shows a third embodiment of the invention.

FIG. 4 shows a third embodiment of the present invention, which represents a digital implementation of the inventive method. The output signal 1 to be evaluated is input together with the reference signal 3 in a comparator 20. The output signal 21 of the comparator 20 is on logical "high" or on logical "low" depending whether the output signal 1 is above or below the reference signal 3. This digital output signal 21 is subsequently oversampled by oversampling means 22. Accordingly, oversampling is performed before integration in this third embodiment. Possible oversampling rates are four or eight times of the frequency of the clock signal on clock line 11. The oversampled signals 23 are input in a means 24 for combined integration and comparison. An evaluation rule can be implemented in those means 24, e.g. the decision whether the output signal 25 of this means 24 is logical "high" or logical "low" depends on the majority of logical levels of the oversampled signals 23. It is also possible, to implement more complex evaluation rules in means 24, e.g. to give more weight to one or some of the oversampled signals 23.

First, second and third embodiments shown in FIGS. 2 to 4 can be regarded as embodiments of the first type of embodiments of the present invention mentioned above.

Figure 5:
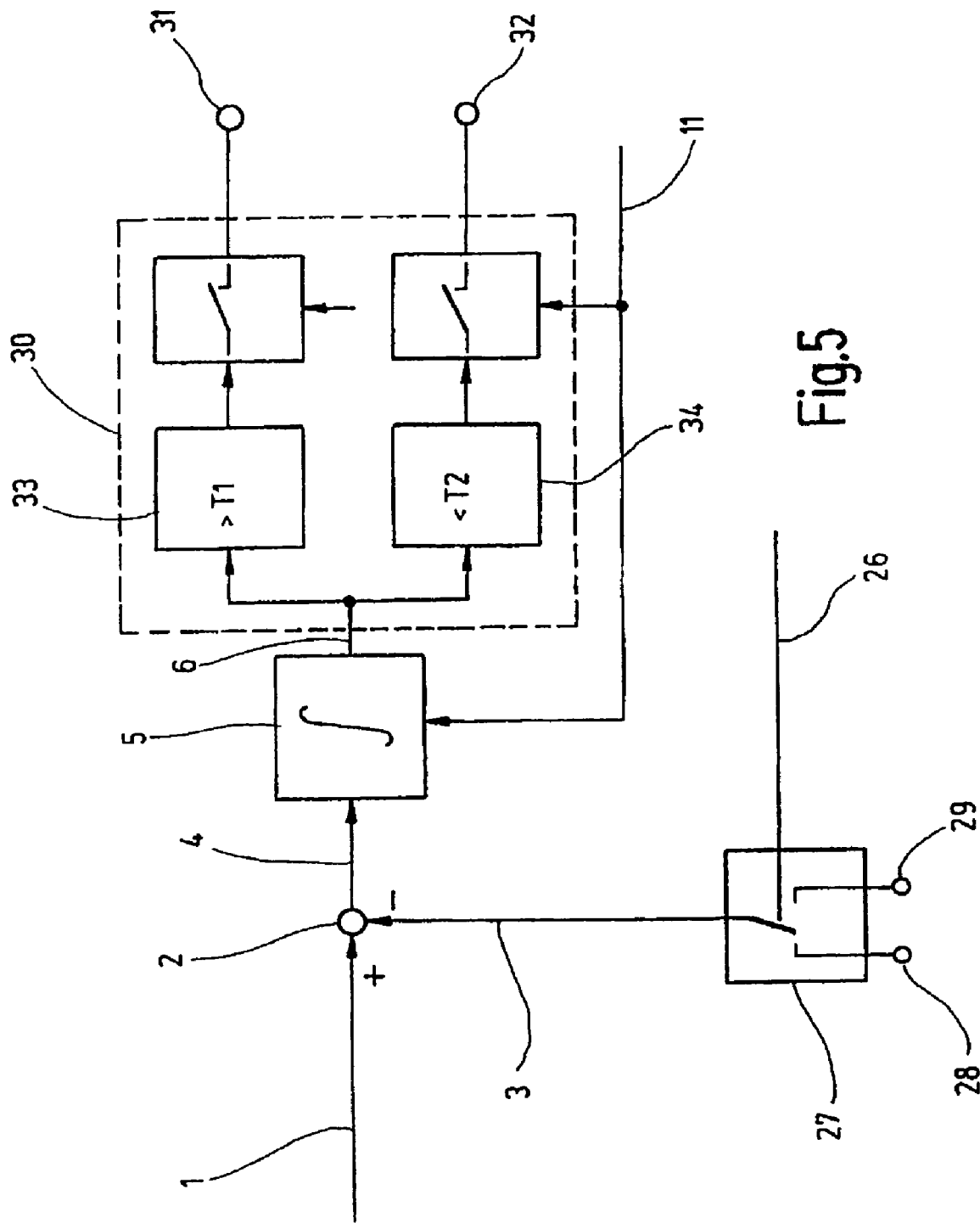
FIG. 5 shows a fourth embodiment of the invention.

FIG. 5 shows a fourth embodiment of the present invention. According to the this fourth embodiment the difference between the output signal 1 of the DUT and of a reference signal 3 is integrated by means 5 for integrating, wherein the reference signal 3 is a signal value corresponding to the bit value expected within the particular clock period. The expected bit value 26 controls a switch 27, e.g. for an expected bit value "1" the switch connects a high voltage electrode 28 as reference signal 3, and for an expected bit value "0" the switch 27 connects a low voltage electrode 29 as reference signal 3.

The output signal 6 of the means 5 for Integration is input to a window comparator 30 having first and second output electrodes 31, 32, each of which being associated to one of two comparator elements 33, 34 respectively. T1 and T2 set error limits within 30 and output signals at 31 and 32 of 30 are error signals. In an error-free situation the value of the integrated difference signal 6 will be zero. The first comparator element 33 compares the integrated difference signal 6 with a first threshold value T1. If the integrated difference signal 6 is higher than threshold T1, then the first output 31 is a logical "high", otherwise the first output 31 is a logical "low". The second comparator element 34 compares the integrated difference signal 6 with a second threshold value T2. If the integrated difference signal 6 is lower than threshold T2, then the second output 32 is a logical "high", otherwise the second output 32 is a logical "low".

The threshold values T1, T2 can be adjusted, in particular are programmable in a preferred embodiment. The output 31 represents the case that the output signal 1 is significantly higher than according to the signal level for the expected bit value 26. Therefore, if output 31 is logical "high" this can be interpreted as a bit error. The output 32 represents the case, if the output signal 1 is significantly lower than expected. Accordingly, if output 32 is logical "high" this also can be interpreted as a bit error.

Figure 6:
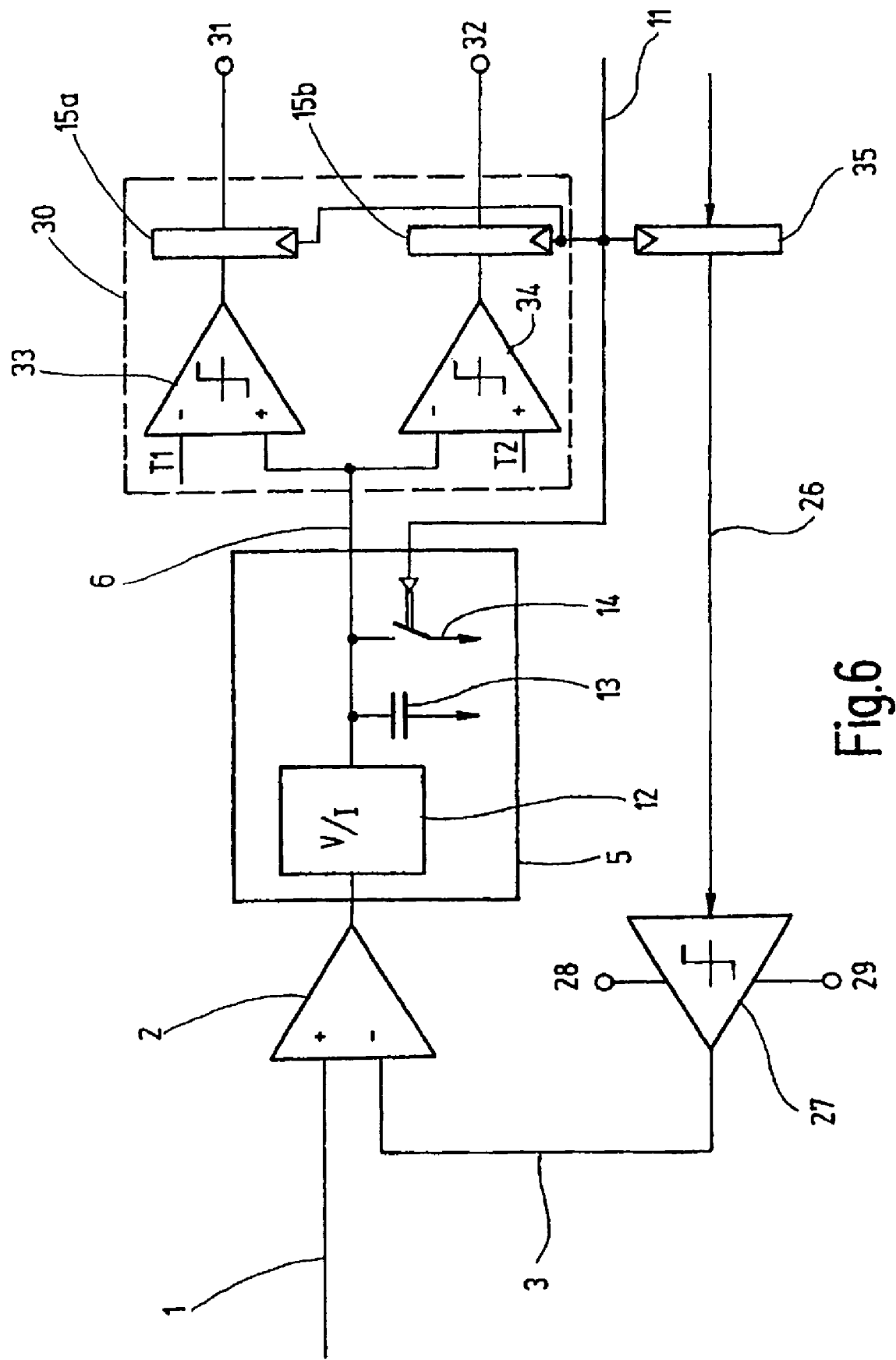
FIG. 6 shows the fourth embodiment of FIG. 5 in some more detail.

FIG. 6 shows the fourth embodiment of FIG. 5 in some more detail. Similar to the embodiment shown in FIG. 2 the difference calculating means 2 is realized by an operational amplifier and the means 5 for integrating are realized by a voltage-to-current converter 12 and a capacitor 13 that can be reset by switch 14, which is controlled by clock line 11. The switch 27 is realized by an operational amplifier. The passing of the expected bit value 26 to the input of a switch 27, as well as the passing of the output of the first and second comparator elements 33, 34 to first and second output electrodes 31, 32 is controlled by the clock line 11 using switches 15a, 15b and 35, wherein the switches 15a, 15b for the first and second output electrodes 31, 32 can be integrated in the window comparator 30.

Figure 7:
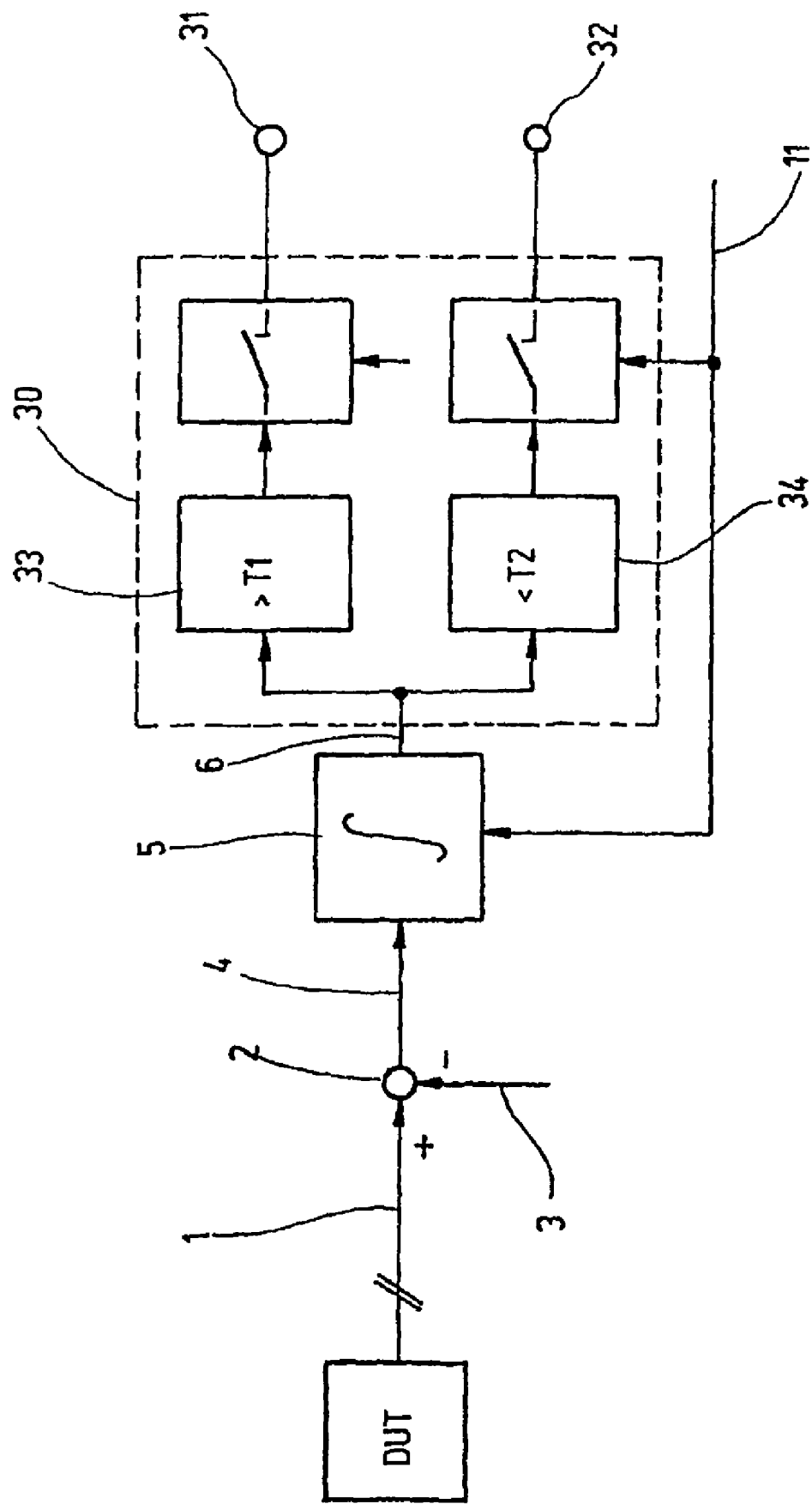
FIG. 7 shows a fifth embodiment of the invention.

FIG. 7 shows a fifth embodiment of the invention. The block diagram represents a method for evaluating an output signal 1 of a device under test DUT. A first difference calculating means 2 generates a difference signal 4 representing the difference between the output signal 1 and a reference signal 3. In this embodiment the reference signal 3 is set to a value between the voltage representing a logical "low" and the voltage representing a logical "high". Preferably reference signal 3 is the mean value of the voltage representing a logical "low" and the voltage representing a logical "high".

The difference signal 4 is integrated by means 5 for integrating. The output signal 6 of the means 5 for integrating is input to a window comparator 30 having first and second output electrodes 31, 32, each of which being associated to one of two comparator elements 33, 34 respectively. T1 sets the limit for an "acceptable good high" and T2 sets the limit for an "acceptable good low" within 30. For example voltage T1 may be a small positive value and voltage T2 may be a small negative value. A "low" at the output signal 1 of the DUT will be rated to be an "acceptable good low" if output 32 becomes "high". A "high" at the output signal 1 of the DUT will be rated to be an "acceptable good high" if output 31 becomes "high". If both outputs 31 and 32 become "low" at the same time this indicates an error of the DUT and the DUT is rated to be defective.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A method for evaluating an output signal of a Device Under Test, wherein said Device Under Test outputs said output signal in response to an input signal provided by an Automated Test Equipment, and wherein said output signal includes a sequence of bit levels, said method comprising steps of:

continuously comparing said output signal of said Device Under Test and a reference signal to generate a difference signal representing the differences between said output signal of said Device Under Test and said reference signal, integrating said difference signal during a clock period respectively, resulting in an integrated difference signal, and evaluating said integrated difference signal with regard to a bit level to be assigned to said output signal of said Device Under Test during the respective clock period.

2. The method of claim 1, wherein said evaluating step comprises a step of comparing said integrated difference signal with at least one comparative signal.

3. The method of claim 2, wherein said comparing is performed continuously resulting in a continuous comparison signal, and that for evaluating of said output signal of said Device Under Test said continuous comparison signal is sampled at predetermined points in time.

4. The method of claim 1, wherein said integrating of said difference signal is performed continuously.

5. The method of claim 1, wherein said integrated difference signal is periodically reset to a predetermined value, and reset once in each clock period to the value zero.

6. The method of claim 1, wherein said reference signal is a predetermined threshold value signal.

7. The method of claim 6, wherein an output signal of said comparison is oversampled, and said integrating and evaluating are based on said oversampled output signal of said comparison of said output signal of said Device Under Test and said predetermined threshold value signal.

8. The method of claim 1, wherein said reference signal is a binary signal representing a bit value expected for said output signal of said Device Under Test in said respective clock period.

9. The method of claim 8, wherein low and/or high level of said binary signal can be adjusted.

10. A software program or product, stored in a non-transitory form on a data carrier, for executing a method for evaluating an output signal of a Device Under Test, wherein said Device Under Test outputs said output signal in response to an input signal provided by an Automated Test Equipment, and wherein said output signal includes a sequence of bit levels, said method comprising steps of:

continuously comparing said output signal of said Device Under Test and a reference signal to generate a difference signal representing the differences between said output signal of said Device Under Test and said reference signal, integrating said difference signal during a clock period respectively, resulting in an integrated difference signal, and evaluating said integrated difference signal with regard to a bit level to be assigned to said output signal of said Device Under Test during the respective clock period, when running on a data processing system such as a computer.

11. A system for evaluating an output signal of a Device Under Test, wherein said Device Under Test outputs said output signal in response to an input signal provided by an Automated Test Equipment, and wherein said output signal includes a sequence of bit levels, said system comprising:

a generator for continuously comparing said output signal of said Device Under Test and a reference signal to generate a difference signal representing the differences between said output signal of said Device Under Test and said reference signal, an integrator for integrating said difference signal during a clock period respectively, resulting in an integrated difference signal, and an evaluator for evaluating said integrated difference signal with regard to a bit level to be assigned to said output signal of said Device Under Test during the respective clock period.

* * * * *